United States Patent [19]

Tabata et al.

[11] Patent Number: 4,866,313
[45] Date of Patent: Sep. 12, 1989

[54] CASCODE BIMOS DRIVING CIRCUIT USING IGBT

[75] Inventors: Mituharu Tabata; Gourab Majumdar, both of Itami, Japan

[73] Assignee: Mitsubishi Denki Kabushiki Kaisha, Tokyo, Japan

[21] Appl. No.: 249,997

[22] Filed: Sep. 27, 1988

[30] Foreign Application Priority Data

Nov. 18, 1987 [JP] Japan .................. 62-292708

[51] Int. Cl.$^4$ .......................................... H03K 17/10
[52] U.S. Cl. ................................ 307/570; 307/264; 307/270; 307/561; 307/631; 357/23.4
[58] Field of Search ............... 307/450, 570, 551, 559, 307/561, 565, 264, 270, 631, 640, 317 R; 357/23.4, 23.13; 361/91

[56] References Cited

U.S. PATENT DOCUMENTS

| | | | |
|---|---|---|---|
| 4,198,648 | 4/1980 | Nishizawa | 307/446 X |
| 4,360,744 | 11/1982 | Taylor | 307/270 X |
| 4,396,932 | 8/1983 | Alonas et al. | 307/631 X |
| 4,547,686 | 10/1985 | Chen | 307/264 X |
| 4,551,643 | 11/1985 | Russell et al. | 307/570 |
| 4,651,035 | 3/1987 | Shigekane | 307/570 |
| 4,721,869 | 1/1988 | Okado | 307/570 |
| 4,739,199 | 4/1988 | Shigekane | 307/570 |
| 4,746,814 | 5/1988 | Shigekane | 307/570 X |
| 4,794,441 | 12/1988 | Sugawara et al. | 357/23.4 X |
| 4,798,983 | 1/1989 | Mori | 307/570 |

FOREIGN PATENT DOCUMENTS

| | | | |
|---|---|---|---|
| 0155059 | 9/1985 | European Pat. Off. | 307/570 |
| 0176168 | 8/1987 | Japan | 357/23.4 |

OTHER PUBLICATIONS

FET-Gated High Voltage Bipolar Transistors, Department of Electrical Engineering Virginia Polytechnic Institute and State University, Blacksburg, VA 24061, Dan Y. Chen, S. Chandrasekaran.
A New BiMOS Switching Stage for 10 KW Range by E. Hebenstreit Siemens Ag, Components Group, Munich, West Germany.
Present Trends in Variable Speed AC Drives, V. R. Stefanovic General Electric Company.

*Primary Examiner*—David Hudspeth
*Attorney, Agent, or Firm*—Oblon, Spivak, McClelland, Maier & Neustadt

[57] ABSTRACT

A cascode BiMOS driving circuit according to the present invention has an IBGBT (9) connected between a first output terminal (3) and the base of a bipolar transistor (Q1). An IGBT generally has a low on-state resistance, and hence a chip area for the IGBT (9) is not so increased, even if the breakdown voltage of the IGBT (9) is made about equal to that of the bipolar transistor (Q1). Thus, a cascode BiMOS driving circuit of low cost and low input capacitance can be implemented. Further, the IGBT (9) is gently turned off due to a so-called tail phenomenon, to prevent an abrupt turn off of the bipolar transistor (Q1), to whereby prevent an occurrence of a surge voltage.

5 Claims, 3 Drawing Sheets

CASCODE BIMOS DRIVING CIRCUIT USING IGBT

BACKGROUND OF THE INVENTION

1. Field of the Invention

The present invention relates to a cascode BiMOS driving circuit for driving a cascode BiMOS (bipolar metal oxide semiconductor) which is used for a switching element.

2. Description of the Background Art

FIG. 1 is a circuit diagram showing a conventional cascode BiMOS driving circuit. Referring to FIG. 1, a cascode BiMOS 1 comprises an NPN transistor Q1 and an N channel MOS field effect transistor (hereinafter referred to as MOSFET) 2. The transistor Q1 has a collector connected to a first output terminal 3, an emitter connected to the drain of the MOSFET 2 and a base coupled to a second output terminal 5 through an excessive voltage absorbing circuit 4 comprising a diode D1 and a d.c. bias voltage source V which are serially connected. The excessive voltage absorbing circuit 4 is turned on when a voltage applied across the circuit 4 exceeds a predetermined voltage. The MOSFET 2 has a drain connected to the emitter of the transistor Q1, a source connected to the second output terminal 5 and a gate connected to a first control terminal 6. A second control terminal 8 is connected to the gate of a MOSFET 7 which has a drain connected to the colletor of the transistor Q1 and a source connected to the base of the transistor Q1.

The turn on operation of the cascode BiMOS 1 is as follows: When the cascode BiMOS 1 is in an off state, the transistor Q1 and MOSFET's 2 and 7 are in an off state, and no current flows through the excessive voltage absorbing circuit 4. A voltage applied across the first and second output terminals 3 and 5 is blocked by the transistor Q1 and the MOSFET 2. Control signals are applied through the fist and second control terminals 6 and 8, to turn on the MOSFET's 2 and 7. A gate current is supplied from the fist output terminal 3 to the gate of the transistor Q1 through the MOSFET 7, so that the transistor Q1 is turned on. Thus, the cascode BiMOS 1 is turned on, and a current flows from the first output terminal 3 to the second output terminal 5 through the transistor Q1 and the MOSFET 2. In this case, a higher voltage than the predetermined voltage is not applied across the excessive voltage absorbing circuit 4. Therefore, the excessive voltage absorbing circuit 4 is not turned on, so that no current follows through the excessive voltage absorbing circuit 4.

The turn off operation of the cascode BiMOS 1 is as follows: Control signals are applied through the first and second control terminals 6 and 8, to turn off the MOSFET's 2 and 7. The current, flowing from the first output terminal 3 to the second output terminal 5 through the transistor Q1 and the MOSFET 2, is blocked by the turned off MOSFET 2, so that the drain-to-source voltage of the MOSFET 2 is increased. The base-to-emitter junction of the transistor Q1 is still in an on state, since many charges are accumulated in the transistor Q1. Therefore, a voltage across the base of the transistor Q1 and the source of the MOSFET 2 is increased. When this voltage exceeds the predetermined voltage, the excessive voltage absorbing circuit 4 is turned on. Upon this turn on of the excessive voltage absorbing circuit 4, charges accumulated in the base of the transistor Q1 is rapidly discharged through the excessive voltage absorbing circuit 4, so that the transistor Q1 is turned off. Thus, the cascode BiMOS 1 is turned off. The cascode BiMOS 1 alternates the turn on state and the turn off state by repeating the above operation.

In the cascode BiMOS driving circuit structured as hereinbefore described, the breakdown voltage of the MOSFET 7 must be about the same as that of the transistor Q1. In general, assuming that a MOSFET is the same in size as a bipolar transistor to pass the same current, the breakdown voltage of the MOSFET is lower than that of the bipolar transistor. It is known that the on-state resistance of a MOSFET becomes five to six times as large when the breakdown voltage of the MOSFET is twice increased. Therefore, it is necessary to increase channel length and width of the MOSFET 7, in order to make the breakdown voltage of the MOSFET 7 equal to that of the transistor Q1 and make current value flowing through the MOSFET 7 equal to that flowing through the transistor Q1. Thus, the MOSFET 7 occupies larger chip area than the transistor Q1. As a breakdown voltage required for the transistor Q1 is increased, a chip area for the MOSFET 7 becomes larger in comparison with a chip area for the transistor Q1. As a result, the input capacitance of the MOSFET 7 and a manufacturing cost are disadvantageously increased.

Further, the cascode BiMOS driving circuit shown in FIG. 1 needs a control circuit (not shown) for preventing a surge voltage cased at the first and second output terminals 3 and 5 by abrupt turn off of the transistor Q1. This control circuit operates to slightly delay the turn off timing of the MOSFET 7 in comparison with that of the MOSFET 2, by making applying timings of control signals to the first and second control terminals 6 and 8 different. Thus, charge and discharge of a base current of the transistor Q1 simultaneously occur through the MOSFET 7 and the excessive voltage absorbing circuit 4, so that the transistor Q1 is gently turned off.

SUMMARY OF THE INVENTION

A cascode BiMOS driving circuit in accordance with the present invention comprises first and second output terminals, first and second control terminals, and a cascode BiMOS. The cascode BiMOS comprises a bipolar transistor having a base, a first electrode connected to the first output terminal and a second electrode, and a MOS field effect transistor having a gate connected to the first control terminal, a first electrode connected to the second electrode of the bipolar transistor and a second electrode connected to the second output terminal. The cascode BiMOS driving circuit further comprises excessive voltage absorbing means which is connected between the base of the bipolar transistor and the second output terminal and turned on to pass a current when a voltage across the excessive voltage absorbing means exceeds a predetermined voltage, and an insulated gate bipolar transistor having a gate connected to the second control terminal, a first electrode connected to the first output terminal and a second electrode connected to the base of the bipolar transistor.

According to the present invention, even if the breakdown voltage of the insulated gate bipolar transistor is made approximately equal to that of the bipolar transistor, a chip area for the insulated gate bipolar transistor is not so increased, because an insulated gate bipolar transistor generally has a low on-state resistance. Further, the insulated gate bipolar transistor is slowly turned off due to a so-called tail phenomenon, to prevent an abrupt turn off of the bipolar transistor.

Accordingly, it is an object of the present invention to provide a cascode BiMOS driving circuit which can decrease a chip area and a manufacturing cost in integration and prevent a surge voltage caused at the time of turn off.

These and other objects, features, aspects and advantages of the present invention will become more apparent from the following detailed description of the present invention when taken in conjunction with the accompanying drawings.

DETAILED DESCRIPTION OF THE EMBODIMENTS

Figure 1:
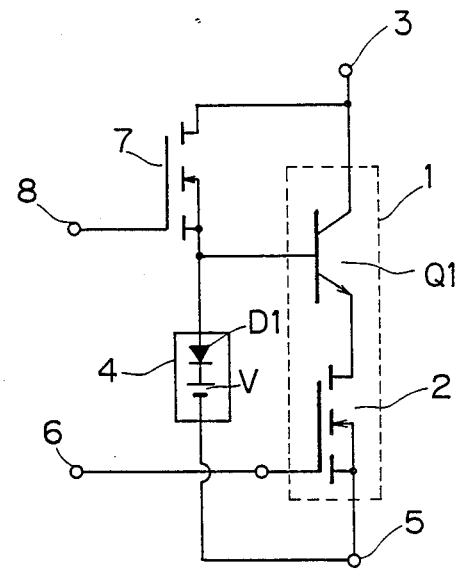
FIG. 1 is a circuit diagram showing a conventional cascode BiMOS driving circuit.
Figure 2:
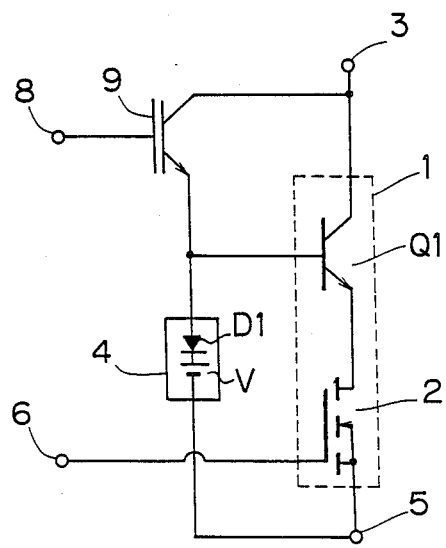
FIG. 2 is a circuit diagram showing a cascode BiMOS driving circuit in accordance with the present invention.

FIG. 2 is a circuit diagram showing an embodiment of a cascode BiMOS driving circuit in accordance with the present invention. Referring to FIG. 2, this cascode BiMOS driving circuit has an N channel insulated gate bipolar transistor (hereinafter referred to as IGBT) 9, in place of the MOSFET 7 in the conventional cascode BiMOS driving circuit shown in FIG. 1. The IGBT 9 has a base connected to a second control terminal 8, a collector connected to the collector of a transistor Q1 and an emitter connected to the base of the transistor Q1. Other structures are the same as the circuit shown in FIG. 1.

Figure 3:
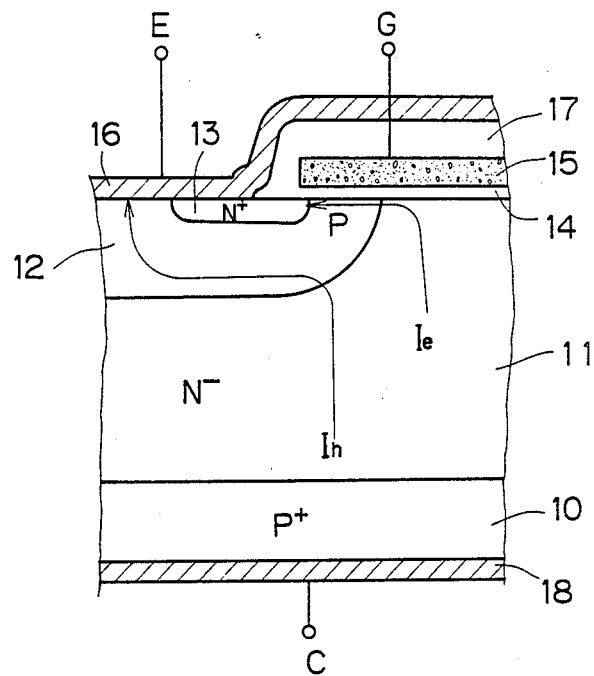
FIG. 3 is a cross-sectional view showing the structure of an IGBT cell.
Figure 4:
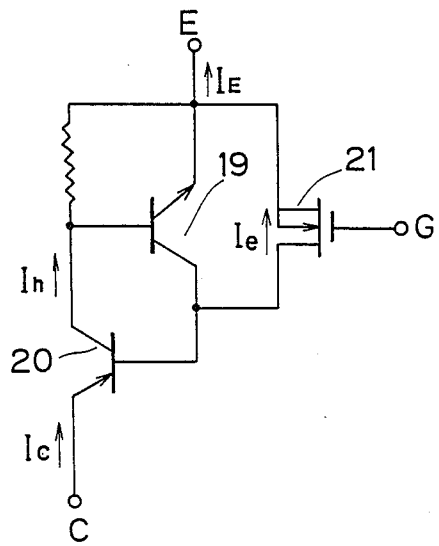
FIG. 4 is a circuit diagram showing the equivalent circuit of the structure shown in FIG. 3.

FIG. 3 is a cross-sectional view showing the typical structure of a cell of the N channel IGBT 9, and FIG. 4 is a circuit diagram showing an equivalent circuit thereof. Typical structure and turn off characteristics of an IGBT element will now be described with reference to FIG. 3 and FIG. 4.

Referring to FIG. 3, numeral 10 indicates a P+ type collector layer consisting of a P+ type semiconductor substrate, which is provided on one major surface thereof with an N− epitaxial layer 11. A P type well region 12 is formed partially in the surface of the N− type epitaxial layer 11 by selectively diffusing P type impurities, and an N+ type emitter region 13 is formed partially in the surface of the P type well region 12 by selectively diffusing N type impurities in high concentration. A gate insulation film 14 is formed on a portion of the surface of the P type well region 12 between the surfaces of the N− type epitaxial layer 11 and the N+ type emitter region 13. This gate insulation film 14 also covers the surface of the N− type epitaxial layer 11 to be integrated with gate insulation films of adjacent IGBT cells. A gate electrode 15 of polysilicon, for example, is formed on the gate insulation film 14, and an emitter electrode 16 of metal such as aluminum is formed to be electrically connected to both the P type well region 12 and the N+ type emitter region 13. The gate electrode 15 and the emitter electrode 16 are provided in multilayer structure through an insulation film 17, to be commonly electrically connected to each cell forming the IGBT device. A collector metal electrode 18 is formed on the back surface of the P+ type collector layer 10 in common with all IGBT cells.

An N channel MOS structure is provided in the vicinity of the portion of the surface of the P type well region 12 between the N− type epitaxial layer 11 and the N+ type emitter region 13. A positive voltage is applied to the gate electrode 15 through a gate terminal G so that electrons flow from the N+ type emitter region 13 to the N− type epitaxial layer 11 through a channel formed in the vicinity of the portion of the surface of the P type well region 12 under the gate electrode 15. Symbol $I_e$ indicates an electron current thus carried. On the other hand, holes, which are minority carriers, are injected from the P+ type collector layer 10 into the N− type epitaxial layer 11. A portion of the holes dissipate through recombination with the aforementioned electrons, while the remaining holes flow in the P type well region 12 as a hole current $I_h$. Thus, the IGBT basically operates in a bipolar manner and conductivity is increased in the N−type epitaxial layer 11 due to a conductivity modulation effect, whereby lower on-state voltage and larger current capacity can be implemented in contrast to a conventional power MOS.

It is to be noted that a parasitic PNPN thyristor structure is present in the IGBT cell, as is obvious from an equivalent circuit shown in FIG. 4. Such a parasitic thyristor is formed by an NPN transistor 19 defined by the N− type epitaxial layer 11, the P type well region 12 and the N+ type emitter region 13 and a PNP transistor 20 defined by the P+ type collector layer 10, the N− type epitaxial layer 11 and the P type well region 12. When both of the transistors 19 and 20 enter their respective operating states and when the sum of current gains $\alpha_1$ and $\alpha_2$ thereof becomes 1, the parasitic thyristor conducts and thereby causes a latch-up phenomenon. Since the thickness of the N− type epitaxial layer 11 serving as the base of the PNP transistor 20 is much larger than the carrier diffusion length, the value $\alpha_2$ is relatively small. Further, there is a short circuit between the emitter and the base of the NPN transistor 19, so that the transistor 19 barely enters the on state. Therefore, no latch-up phenomenon is caused in the normal operating state, and the IGBT cell operates as a composite element of an N channel MOSFET 21 and the PNP transistor 20. In this case, the base current of the PNP transistor 20 is controlled by the N channel MOSFET 21 and, therefore, a main current $I_C$ flowing from a collector terminal C of the IGBT can be controlled by a control signal applied to the gate terminal G. Assuming that $I_E$ represents a current flowing is an emitter terminal E, the main current $I_C$ is:

$$I_C = I_E = I_e + I_d$$

Figure 5:
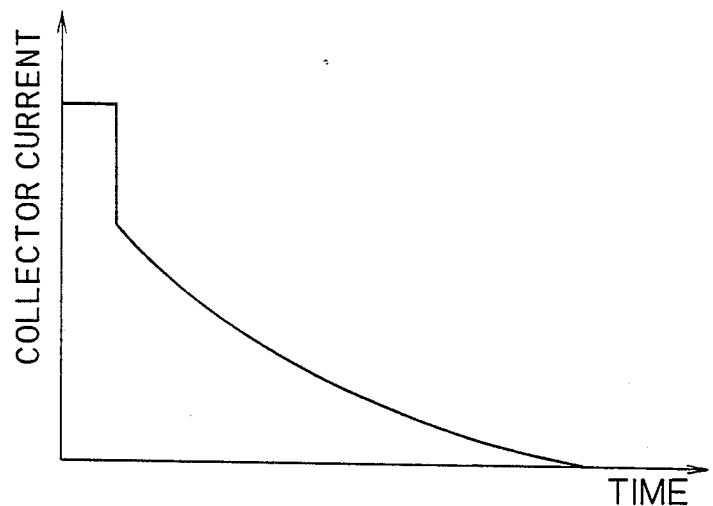
FIG. 5 is a view showing turn off characteristics of an IGBT.

FIG. 5 is a view showing general turn off characteristics of an IGBT. As shown in FIG. 5, an IGBT generally has turn off characteristics in which it is gently turned off due to a so-called tail phenomenon in a turn off transition.

In the operation of the cascode BiMOS driving circuit shown in FIG. 2, the turn on operation of the cascode BiMOS 1 is similar to that of the conventional circuit shown in FIG. 1.

The turn off operation of the cascode BiMOS 1 is as follows: Control signals are simultaneously applied to gates of a MOSFET 2 and the IGBT 9 through fist and second control terminals 6 and 8, respectively, to turn off the MOSFET 2 and the IGBT 9. Upon the application of the control signals, the MOSFET 2 is immediately turned off, while the IGBT 9 is gently turned off due to the tail phenomenon as hereinbefore described.

A load current, flowing from a first output terminal 3 to a second output terminal 5 through the transistor Q1 and the MOSFET 2, is blocked by the MOSFET 2 as immediately turned off, so that the drain-to-source voltage of the MOSFET 2 is increased. The base-to-emitter junction of the transistor Q1 is still in an on state, since the IGBT 9 is not perfectly turned off to supply a base current to the transistor Q1. Therefore, a voltage across the base of the transistor Q1 and the source of the MOSFET 2 is increased. When this voltage exceeds a predetermined voltage, an excessive voltage absorbing circuit 4 is turned on.

At this stage, the IGBT 9 is not still completely turned off due to the tail phenomenon. Thus, charge and discharge of the base current of the transistor Q1 simultaneously occur through the MOSFET 7 and the excessive voltage absorbing circuit 4, so that the transistor Q1 is gently turned off. Thus, a surge voltage is not caused at the first and second output terminals 3 and 5. According to this embodiment, the cascode BiMOS driving circuit dose not need an additional control circuit for preventing the surge voltage caused at the first and second output terminals 3 and 5 by abrupt turn off of the transistor Q1.

The breakdown voltage of the IGBT 9 must be about the same as that of the transistor Q1. As hereinbefore described, an IGBT generally has a lower on-state resistance than a power MOS. Therefore, even if the breakdown voltage of the IGBT 11 is made equal to that of the transistor Q1, while current value flowing through the IGBT 11 is made equal to that flowing through the transistor Q1, a chip area required for the IGBT 11 is not so increased in comparison with the transistor Q1. As a result, in accordance with this embodiment, the input capacitance of the IGBT and a manufacturing cost can be decreased.

The NPN transistor Q1 and the N channel MOSFET 2 and IGBT 9 may be replaced by a PNP transistor and P channel MOSFET and IGBT, respectively, if a diode D1 in the excessive voltage absorbing circuit 4 is connected in opposit direction.

The excessive voltage absorbing circuit 4, which comprises the diode 4 and a d.c. bias voltage source V, may be replaced by an electronic or mechanical switch which is adapted to be turned on/off in a period corresponding to the turn on/off period of the excessive voltage absorbing circuit 4.

Figure 6:
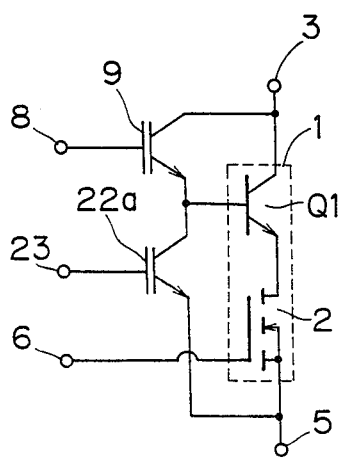
FIG. 6 and FIG. 7 are circuit diagrams showing another embodiment of the cascode BiMOS driving circuit in accordance with the present invention.

FIG. 6 is a circuit diagram showing another embodiment of the cascode BiMOS driving circuit in accordance with the present invention. Referring to FIG. 6, this cascode BiMOS driving circuit has an N channel IGBT 22a in place of the excessive voltage absorbing circuit 4 shown in FIG. 2. The IGBT 22a has a gate connected to a third control terminal 23, a collector connected to the base of a transistor Q1 and an emitter connected to a second output terminal 5. Other structures are the same as those of the circuit shown in FIG. 2.

In the operation of this cascode BiMOS driving circuit, the IGBT 22a is turned on/off by a control signal applied through the third control terminal 23, in a timing corresponding to the turn on/off timing of the excessive voltage absorbing circuit 4 shown in FIG. 2. Thus, a cascode BiMOS 1 is turned on/off by control signals applied through control terminals 6 and 8, in the same manner as the embodiment illustrated in FIG. 2.

Figure 7:
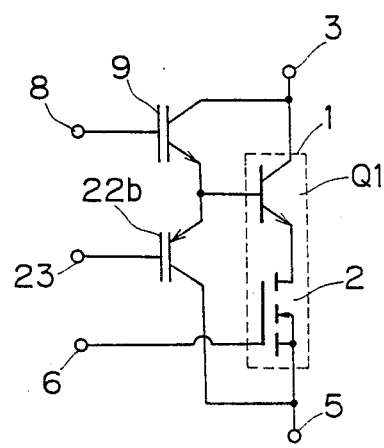

The N channel IGBT 22a may be replaced by a P channel IGBT 22b, as shown in FIG. 7. In this case, the IGBT 22b can be controlled by the same control signal as a MOSFET 2 and an IGBT 9, in other words, only one control signal is sufficient for controlling a cascode BiMOS 1.

It is not preferable that a bipolar transistor or a MOSFET is used in place of the IGBT 22a or 22b. If a bipolar transistor is used, the control signal applied to the third control terminal 23 may exert bad influence on the operation of the cascode BiMOS 1 through its base not electrically insulated. To the contrary, gates of the IGBT's 22a and 22b are in a floating state, and hence the control signal applied to the third control terminal 23 never exert bad influence on the operation of the cascode BiMOS 1. On the other hand, if a MOSFET is used, a diode must be added to prevent the back flow of a current, since a MOSFET bidirectionally pass a current. To the contrary, the IGBT's 22a and 22b pass a current in a predetermined direction, and hence an additional diode is not required.

The IGBT's 22a and 22b have a relatively large turn off time due to the tail phenomenon hereinbefore described. However, no voltage is applied across the IGBT's 22a and 22b after the turn off of the transistor Q1 and the IGBT 9, and hence the IGBT's 22a and 22b may be in either turn on or turn off state until the cascode BiMOS 1 is again turned on. Therefore, this relatively large turn off time of the IGBT's 22a and 22b may not be considered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cascode BiMOS driving circuit, comprising: first and second output terminals;
first and second control terminals;
a cascode BiMOS which comprises a bipolar transistor having a base, a first electrode connected to said first output terminal and a second electrode, and a MOS field effect transistor having a gate connected to said first control terminal, a first electrode connected to said second electrode of said bipolar transistor and a second electrode connected to said second output terminal;
excessive voltage absorbing means which is connected between said base of said bipolar transistor and said second output terminal and turned on to pass a current when a voltage across the excessive voltage absorbing means exceeds a predetermined voltage; and
an insulated gate bipolar transistor having a gate connected to said second control terminal, a first electrode connected to said first output terminal and a second electrode connected to said base of said bipolar transistor.

2. A cascode BiMOS driving circuit in accordance with claim 1, wherein
said excessive voltage absorbing means comprises;

a d.c. voltage bias source, and a diode having an anode connected to said base of said bipolar transistor and a cathode coupled to said second output terminal through said d.c. voltage bias source.

3. A cascode BiMOS driving circuit in accordance with claim 1, wherein said excessive voltage absorbing means includes an electronic switch.

4. A cascode BiMOS driving circuit in accordance with claim 3, wherein said electronic switch includes an IGBT having a gate connected to said second control terminal, first electrode connected to said first output terminal and a second electrode connected to said base of said bipolar transistor.

5. A cascode BiMOS driving circuit in accordance with claim 1, wherein said excessive voltage absorbing means include a mechanical switch.

* * * * *